United States Patent [19]

Nakata et al.

[11] Patent Number: 4,906,852

[45] Date of Patent: Mar. 6, 1990

[54] PROJECTION ALIGNMENT METHOD AND APPARATUS

[75] Inventors: Toshihiko Nakata; Masataka Shiba, both of Yokohama, Japan

[73] Assignee: Hitachi, Ltd., Tokyo, Japan

[21] Appl. No.: 305,006

[22] Filed: Jan. 31, 1989

[30] Foreign Application Priority Data

Mar. 10, 1988 [JP] Japan .................................. 63 54968

[51] Int. Cl.$^4$ ............................................. G01N 21/86
[52] U.S. Cl. .................................... 250/548; 356/401
[58] Field of Search ....................... 250/548, 557, 550; 356/400, 401

[56] References Cited

U.S. PATENT DOCUMENTS 4,362,389 12/1982 Koizumi et al. ..................... 356/401
4,725,737 2/1988 Nakata et al. ....................... 250/548
4,795,261 1/1989 Nakata et al. ....................... 356/401

FOREIGN PATENT DOCUMENTS 55-41739 3/1980 Japan .

Primary Examiner—David C. Nelms
Attorney, Agent, or Firm—Antonelli, Terry & Wands

[57] ABSTRACT

A projection alignment method of aligning a mask and a wafer with each other through an optical imaging system and an apparatus for performing the method are disclosed. The apparatus comprises an optical illumination system for illuminating with highly coherent illumination light an alignment pattern formed with a stepped pattern on the wafer and a flat or planar portion of the wafer in the vicinity of the alignment pattern, an optical interference system for making reflected light from the alignment pattern on the wafer and reflected light from the flat portion of the wafer illuminated by the optical illumination system interfere with each other while optically superimposing optical images of both the reflected lights obtained through the optical imaging system on each other. A photo-electric conversion element subjects an interference pattern obtained by the optical interference system to photo-electric conversion, thereby obtaining a signal having a symmetry which represents a stepped portion of the alignment pattern, whereby alignment for the wafer is performed on the basis of the signal obtained from the photoelectric conversion element. With such a construction, any influence of uneven thickness of a resist film applied on the alignment pattern can be reduced and hence a highly symmetrical signal corresponding to the stepped portion of the alignment pattern can be obtained, thereby realizing alignment with high precision.

20 Claims, 12 Drawing Sheets

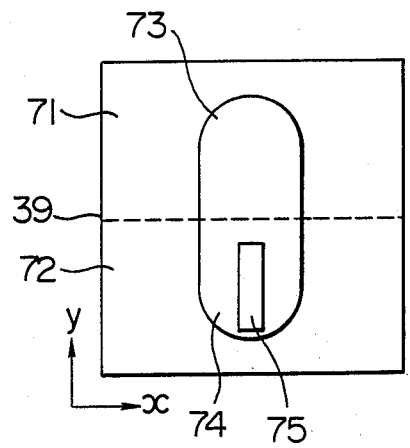
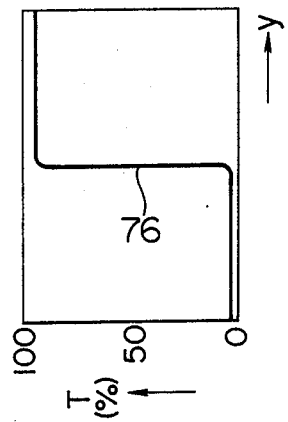
FIG. 4A  FIG. 4B
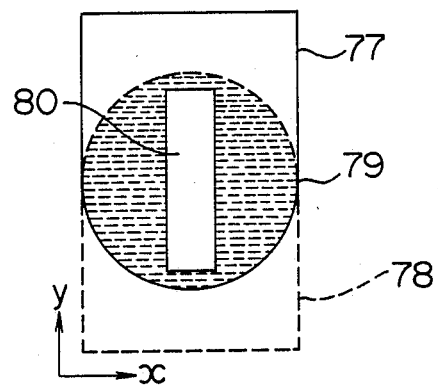
FIG. 5A
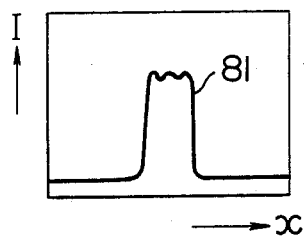
FIG. 5B $$\Delta \ell = \frac{(2N+1)\lambda}{2nr} \quad \Delta \ell = \frac{(2N+1)\lambda}{4nr} \quad \Delta \ell = \frac{N \cdot \lambda}{nr}$$

$$(N = 0, 1, 2, 3, \cdots)$$

PROJECTION ALIGNMENT METHOD AND APPARATUS

BACKGROUND OF THE INVENTION

The present invention relates to an alignment technique for exposure in fabrication of a semiconductor device, and more particularly to a projection alignment method and apparatus suitable for alignment in the case where uneven application of a resist film takes place.

The conventional projection alignment method and apparatus have been disclosed by, for example, JP-A-5541739 (corresponding to U.S. Pat. No. 4,362,389). A main part of the apparatus is shown in FIG. 13. A wafer 3 is exposed to a circuit pattern 120 delineated on a mask (or reticle) 1 through a reduction projection lens 2 which reduces the circuit pattern to one several. The exposure is made one chip by one chip or plural chips by plural chips.

Generally, a semiconductor device is formed through successive superimposed printing of several kinds of circuit pattern. Upon exposure, therefore, it is required to accurately align the circuit pattern 120 on the mask 1 and a circuit pattern 121 already formed on the wafer 3 with each other. This is carried out by detecting a mask alignment pattern 126 on the mask 1 and a wafer alignment pattern 14 on the wafer 3 through optical systems 124 and 125 for alignment and feeding back the amount of positional deviation between both the patterns to a wafer stage 123 as the amount of alignment. FIG. 14 shows the wafer alignment pattern 14 in an enlarged form thereof. The wafer alignment pattern 14 is made of a concavely or convexly stepped pattern (or a pattern involving a level difference therein) and is illuminated with illumination light 122 for alignment in a state in which a resist film 53 is applied on the pattern 14. Reference numeral 52 designates an underlying substrate.

Since the alignment illumination light 122 used in the conventional projection alignment method and apparatus is monochromatic light having a wavelength which is substantially or nearly equal to the wavelength of light used for exposure, a detection signal of the wafer alignment pattern 14 is affected by multiple interference which may generate in the resist film, depending on the thickness of the resist film. Therefore, for example, in the case where the thickness distribution of the resist film in the vicinity of the wafer alignment pattern 14 is symmetrical as shown in FIG. 15A, the detection signal 127 becomes symmetrical as shown in FIG. 15B. But, in the case where the resist film thickness distribution is asymmetrical as shown in FIG. 16A, the detection signal 127 becomes asymmetrical as shown in FIG. 16B. Accordingly, in an alignment method in which the center position of the wafer alignment pattern 14 is determined by virtue of the symmetry of a waveform of the detection signal, the latter case would result in the degradation of detection precision and hence the degradation of alignment precision.

SUMMARY OF THE INVENTION

An object of the present invention is to solve the above-mentioned problem of the conventional projection alignment method and apparatus or to provide a projection alignment method and apparatus in which highly precise alignment can be realized without being affected by uneven application of a resist film.

According to a projection alignment method and apparatus of the present invention, the alignment of a reticle or mask and a wafer with each other prior to exposing the wafer to a circuit pattern on the reticle through an optical imaging system is made by simultaneously illuminating an alignment pattern formed on the wafer and a flat or planar portion provided on the wafer in the vicinity of the alignment pattern with highly coherent illumination light for alignment, making reflected light from the alignment pattern on the wafer and reflected light from the flat portion on the wafer obtained through an optical imaging system interfere with each other in an optically superimposed manner, detecting by an optical system for alignment an interference pattern obtained by the interference and an alignment pattern on the reticle irradiated with illumination light for alignment pattern, determining the amount of alignment from the center positions of the detected interference pattern and alignment pattern, and aligning the reticle and the wafer with each other on the basis of the determined alignment amount.

In order to change a contrast, a difference between an optical path length for the reflected light from the alignment pattern on the wafer and an optical path for the reflected light from the flat portion on the wafer may be variable.

Also, either the wave front of the reflected light from the alignment pattern on the wafer or the wave front of the reflected light from the flat portion on the wafer may be inclined in a direction perpendicular to an alignment pattern position detecting direction in order to obtain a fringe pattern corresponding to a shape of the alignment pattern.

Further, the reflected light from the alignment pattern on the wafer and the reflected light from the flat portion on the wafer are passed through the same reduction projection lens, thereby preventing a disturbance in phase from being produced between the wave front of the reflected light from the alignment pattern on the wafer and the wave front of the reflected light from the flat portion on the wafer.

Furthermore, in order to enhance the contrast of the interference pattern obtained by the optical interference of the reflected light from the alignment pattern on the wafer and the reflected light from the flat portion on the wafer, it is preferable that the alignment illumination light has a coherence which is temporally and spatially high, i.e., the alignment illumination light is one which has a single wavelength and resembles collimated light derived from a point source.

With the above construction, the intensity distribution of the interference pattern detected as a signal can be obtained with a waveform which has a better symmetry without being substantially affected by the thickness distribution of a resist film applied on the alignment pattern and has a high contrast. As a result, an ideally true center position of the pattern can be detected, thereby improving alignment precision. Also, even if a plurality of light-permeable layers (for example, layers made of resist, $SiO_2$, $Si_3N_4$ and so on) are formed on the alignment pattern, there can be obtained a detection signal having a highly symmetrical waveform which clearly represents a stepped portion of the alignment pattern.

BRIEF DESCRIPTION OF THE DRAWINGS

FIG. 4A is a plan view showing images of an alignment pattern portion and a flat portion on an image splitting mirror shown in FIG. 1;

FIG. 4B is a view showing the transmittance distribution of the image splitting mirror;

FIG. 5A is a view showing an interference pattern imaged;

FIG. 5B is a view showing the intensity distribution of the interference pattern in an alignment pattern position detecting direction (or x-direction);

DESCRIPTION OF THE PREFERRED EMBODIMENTS

First of all, the principle of the present invention will be explained in reference with FIGS. 17 to 22.

The present invention has been made under consideration of the fact that a reflectivity at an interface between a resist film applied on a wafer and a stepped pattern portion on an underlying substrate forming an alignment pattern is larger than that at an interface between the resist film and an air. For example, when a stepped pattern made of Si is used as the alignment pattern, the reflectivity at the resist-air interface (the refractive index of air being 1.0 and the refractive index of resist being 1.65 at wavelength of 0.515 $\mu$m) is usually about 6% whereas the reflectivity at the resist-pattern interface (the refractive index of Si being 4.75 to 10.3 at wavelength of 0.515 $\mu$m) is 23% which is about four times as high as the reflectivity at the resist-air interface.

Figure 17:
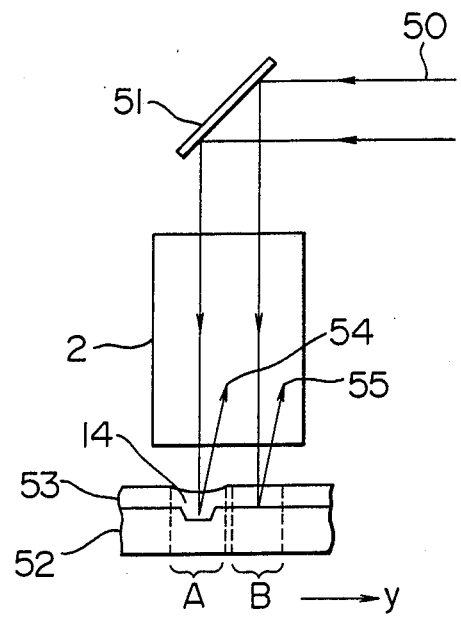
FIG. 17 shows an optical system for explaining the principle of the present invention.
Figure 18:
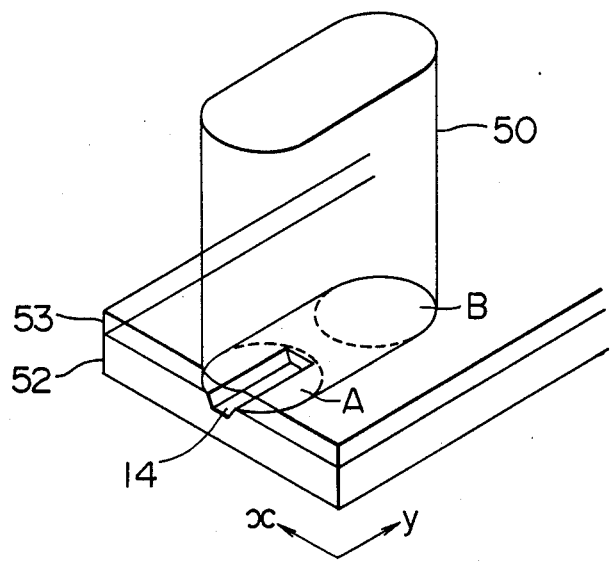
FIG. 18 is an enlarged perspective view showing the state of incidence of illumination light for alignment.

An optical system, as shown in FIG. 17, relying on the principle of the present invention has been contrived. Referring to FIG. 18, a portion A of an alignment pattern 14 on an wafer and a flat or planar portion B provided in the vicinity thereof are simultaneously illuminated with illumination light 50 which emanates from a source of coherent light such as a laser (not shown) and is reflected by a mirror 51 and then passes through a reduction projection lens 2. The alignment pattern 14 is formed as a stepped pattern on an underlying substrate 52 and has a resist film 53 applied thereon. If reflected light 54 from the portion A of the alignment pattern 14 and reflected light 55 from the flat portion B are superimposed on each other in any manner so that the optical paths for the reflected lights 54 and 55 coincide with each other, the reflected lights 54 and 55 interfere with each other to produce an interference pattern (not shown). FIG. 18 shows the state of incidence of the illumination light 50 upon the portion A of the alignment pattern 14 and the flat portion B. The illumination light 50 has an elliptical beam shape which is elongated in a y-direction in order to permit the simultaneous illumination of the portions A and B.

Next, explanation will be made of the interference pattern by virtue of FIGS. 19 to 22.

Figure 19:
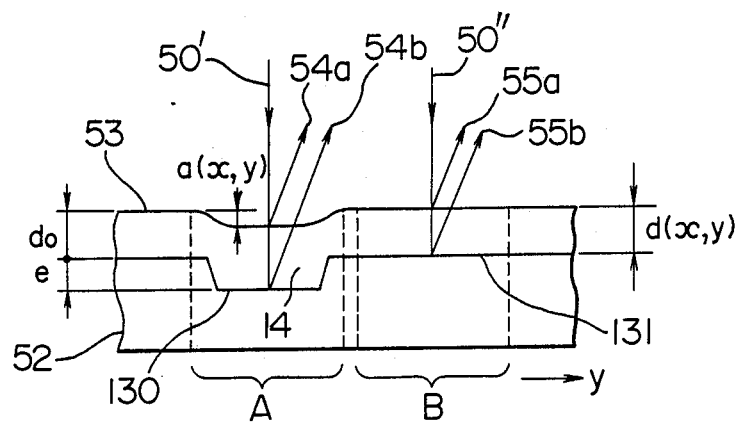
FIG. 19 is a view for explaining reflected light from an alignment pattern portion and reflected light from a flat portion.

FIG. 19 illustrates light reflection at the portion A of the alignment pattern 14 and the flat portion B. As can be understood from the relation in reflectivity between the resist-air interface and the resist-pattern interface which has already been mentioned, an interference pattern produced may be mainly affected by an interference of reflected light 54$b$ from an interface 130 between the resist film 53 and the stepped pattern at the portion A with reflected light 55$b$ from an interface 131 between the resist film 53 and the underlying substrate 52 at the portion B. Therefore, the interference pattern involves a large signal change caused by the fact that a phase change equal to a step depth e is produced at the stepped portion of the alignment pattern 14. Accordingly, the influence of an interference caused by the thickness d (x, y) of the resist film 53 becomes relatively small. A main feature of the present invention lies in that the reflected light from the flat portion B is used as reference light and is made interfere with the reflected light from the portion A of the alignment pattern 14, thereby extracting information of the step or level difference of the alignment pattern 14 with high precision. Accordingly, if the interference pattern and an alignment pattern (not shown) on a reticle are detected by an optical system for alignment (not shown) including a magnifying lens and an image pickup device and the amount of alignment is determined on the basis of the center positions of both the detected patterns, the alignment of the reticle and the wafer with each other can be attained with high precision. Further detailed explanation of the interference pattern will be made. Now assume that the intensity of reflected light 54a from a surface of the resist film 53 at the portion A is $I_{r1}$, the intensity of the reflected light 54b from the interface 130 between the stepped pattern on the underlying substrate 52 and the resist film 53 at the portion A is $I_{s1}$, the intensity of reflected light 55a from a surface of the resist film 53 at the portion B is $I_2$, and the intensity of the reflected light 55b from the interface 131 between the underlying substrate 52 and the resist film 53 at the portion B is $I_{s2}$. The intensity distribution I (x, y) of an interference pattern produced by an interference of those four reflected lights is approximately given by the following equation (1):

$$I(x, y) = (I_{r1} + I_{s1} + I_{r2} + I_{s2}) + \quad (1)$$

$$2\sqrt{I_{r1} \cdot I_{s1}} \cdot \cos\left(\frac{4\pi n_r d(x, y)}{\lambda}\right) +$$

$$2\sqrt{I_{r1} \cdot I_{r2}} \cdot \cos\left(\frac{4\pi n_a a(x, y)}{\lambda}\right) +$$

$$2\sqrt{I_{r1} \cdot I_{s2}} \cdot \cos\left[\frac{4\pi\{n_r d_o - n_a a(x, y)\}}{\lambda}\right] +$$

$$2\sqrt{I_{s1} \cdot I_{r2}} \cdot \cos\left[\frac{4\pi\{n_r d(x, y) + n_a a(x, y)\}}{\lambda}\right] +$$

$$2\sqrt{I_{s1} \cdot I_{s2}} \cdot \cos\left[\frac{4\pi\{n_r d(x, y) + n_a a(x, y) - h_r d_o\}}{\lambda}\right] +$$

$$2\sqrt{I_{r2} \cdot I_{s2}} \cdot \cos\left(\frac{4\pi n_r d_o}{\lambda}\right)$$

Here, $\lambda$ is the wavelength of the alignment illumination light, $n_a$ is the refractive index of the air, and $n_r$ is the refractive index of the resist film. Further, a(x, y) is a hollow of a surface of the resist film 53 in the portion A with respect to that in the portion B which is caused by the difference of the step of the pattern. The first term of the equation (1) corresponds to a DC component of the interference intensity, the second term thereof corresponds to a component of interference of the reflected light 54a and the reflected light 54b, the third term thereof corresponds to a component of interference of the reflected light 54a and 55a, the fourth term thereof corresponds to a component of interference of the reflected light 54a and the reflected light 55b, the fifth term thereof corresponds to a component of interference of the reflected light 54b and the reflected light 55a, the sixth term thereof corresponds to a component of interference of the reflected light 54b and the reflected light 55b, and the seventh term thereof corresponds to a component of interference of the reflected light 55a and the reflected light 55b.

Figure 20:
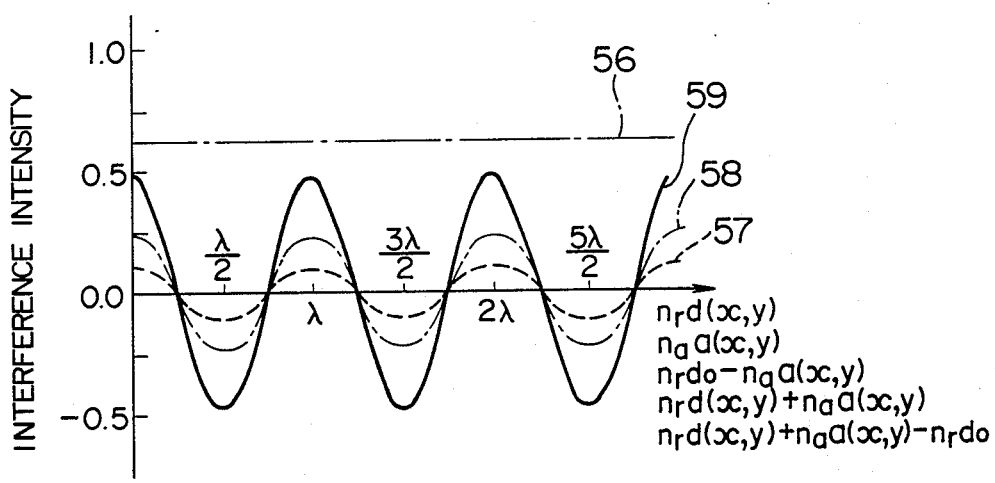
FIG. 20 is a view showing a relationship between an optical path length difference and an interference intensity.

Provided that the intensity of each of illumination lights 50' and 50" is 1, the refractive index $n_a$ of the air is 1, the refractive index $n_r$ of the resist film 53 is 1.65 (at $\lambda = 0.515$ μm), the reflectivity at the surface of the resist 53 is 6% and the reflectivity at each of the interfaces 130 and 131 between the underlying substrate 52 and the resist 53 is 23% (when the substrate 52 is made of Si), the first term of the equation (1) is shown by a straight line 56 in FIG. 20, the third term is shown by a curve 57, the second, fourth and fifth terms are shown by a curve 58, and the sixth term is shown by a curve 59. The seventh term of the equation (1) is a constant depending on the thickness $d_o$ of the resist film 53 and is not influenced by the intensity distribution of the interference pattern. From FIG. 20, it can be understood that the sixth term of the equation (1) or the interference of the reflected light 54b from the interface 130 between the stepped pattern and the resist film 53 at the portion A and the reflected light 55b from the interface 131 between the underlying substrate 52 and the resist film 53 at the portion B gives the largest influence on the intensity distribution of the interference pattern. This is because of the fact that the reflectivity at each of the interfaces 130 and 131 is about four times as high as the reflectivity at the surface of the resist film 53. As a result, the interference pattern exhibits a large signal change due to a change in phase equal to the step depth e at the stepped portion of the alignment pattern 14. Accordingly, the influence of the interference caused by the thickness distribution d(x, y) of the resist film 53 or the second to fifth terms of the equation (1) becomes relatively small.

Figure 21A:
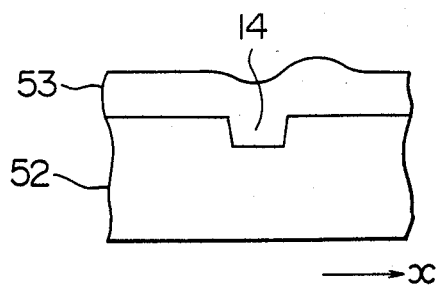
FIG. 21A is a cross section of an alignment pattern portion which involves uneven application of a resist film.
Figures 21B, 21C:
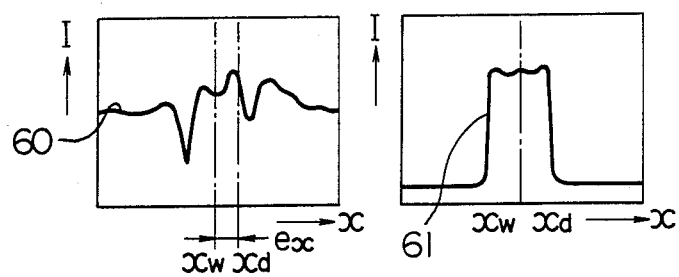
FIG. 21B shows a reflected light intensity distribution obtained in the conventional method.
FIG. 21C shows a reflected light intensity distribution obtained in the present invention.

In the case where the thickness distribution of the resist film 53 is asymmetrical in the stepped portion of the alignment pattern 14 as shown in FIG. 21A, the intensity distribution 60 of reflected light from the alignment pattern 14 obtained in the conventional alignment method becomes asymmetrical as shown in FIG. 21B. In that case, a method of determining the center position of the pattern by use of the symmetry of the waveform regards $x_d$ rather than $x_w$ (the true center position of the pattern) as being the center position of the pattern, thereby yielding a detection error $e_x$. However, the intensity distribution 61 of the interference pattern obtained according to the present invention is provided with an waveform which has a better symmetry without being substantially affected by the thickness distribution of the resist film 53 and has a high contrast, as shown in FIG. 21C. As a result, the true center position $x_w$ of the pattern can be ideally detected. Accordingly, the degradation of alignment precision caused by uneven thickness and uneven application of the resist film can be eliminated.

Figure 22:
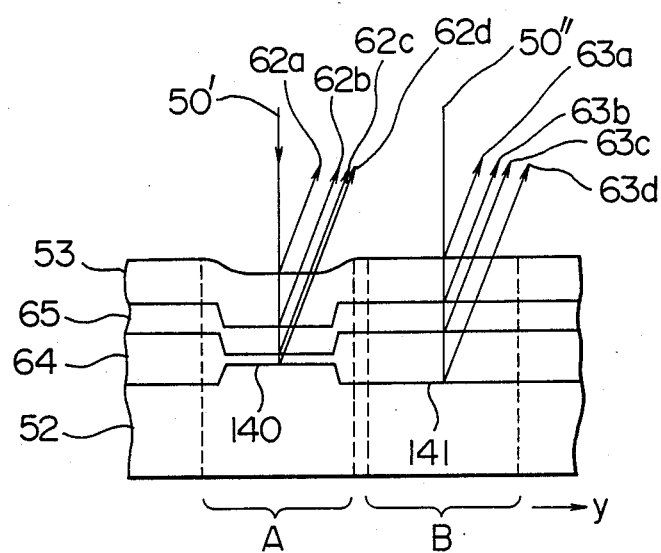
FIG. 22 is a cross section of an alignment pattern portion which includes a plurality of transparent layers.

The present invention is also applicable to an alignment pattern in which a transparent layer 64 made of $SiO_2$ and a transparent layer 65 made of $Si_3N_4$ are formed on the stepped pattern of the Si substrate 52, as shown in FIG. 22. This is because reflected light 62d from an interface 140 between the stepped pattern on the underlying substrate (Si) and the $SiO_2$ layer 64 at the portion A and reflected light 63d from an interface 141 between the underlying substrate (Si) 52 and the $SiO_2$ layer 64 at the portion B have higher intensities among reflected lights 62a to 62d and 63a to 63d from the surface of the resist 53 and respective interfaces between layers for incident lights 50' and 50". Accordingly, the intensity distribution of an interference pattern obtained greatly changes at the stepped portion of the Si substrate 52 but is not substantially affected by the thickness distribution of the resist film 53, thereby providing an effect similar to that which has been mentioned above.

If a difference in length between an optical path for reflected light from the alignment pattern on the wafer and an optical path for reflected light from the flat portion on the wafer is made variable, the contrast can be changed so that a high signal contrast is obtained corresponding to a shape of the stepped portion of the alignment pattern, thereby improving precision for detection of the position of the alignment pattern.

Either the wave front of the reflected light from the alignment pattern on the wafer or the wave front of the reflected light from the flat portion on the wafer may be inclined in a direction perpendicular to an alignment pattern position detecting direction in order to obtain a fringe pattern corresponding to the inclination. The center position of the alignment pattern can be determined by detecting a position where the fringe pattern changes at the stepped position of the alignment pattern. As a result, precision for detection of the position of the alignment pattern can be improved.

In order to make the reflected light from the alignment pattern on the wafer and the reflected light from the flat portion on the wafer optically interfere with each other and to obtain an interference pattern having a high contrast, it is preferable that the alignment illumination light has a temporally and spatially high coherence.

A first embodiment of the present invention will now be explained referring to FIGS. 1 to 6.

Figure 1:
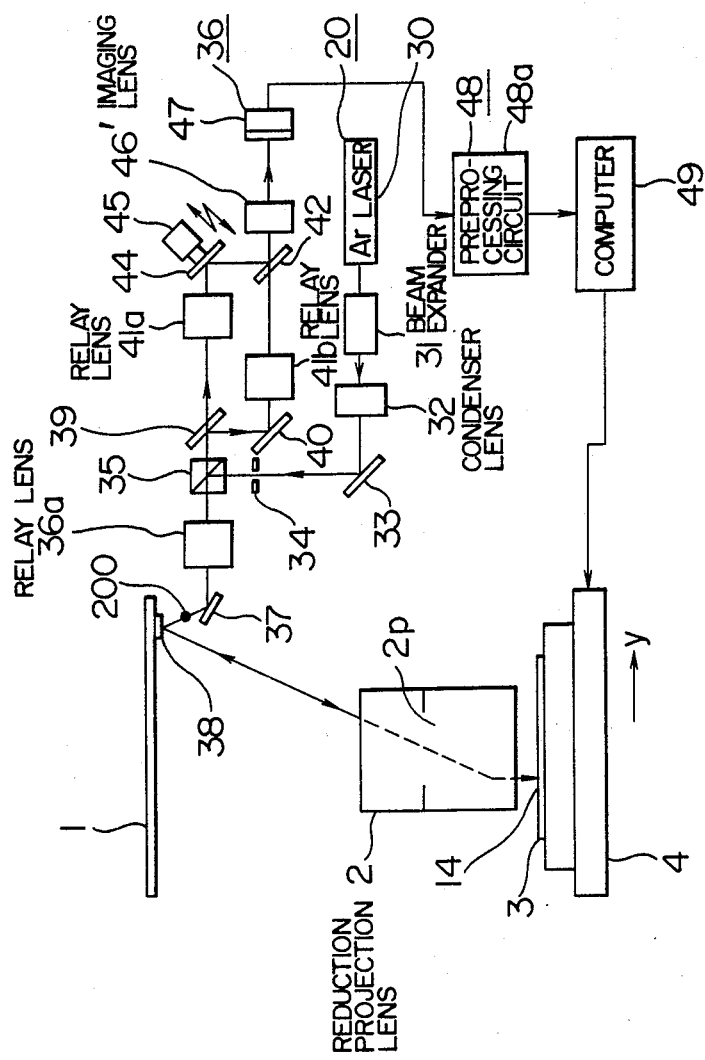
FIG. 1 is a view showing a reduction projection aligner according to a first embodiment of the present invention.

FIG. 1 shows a reduction projection aligner (or stepper) in which a circuit pattern formed on a mask or reticle 1 is projected in a reduced form onto a wafer 3 through a reduction projection lens 2 while moving the wafer 3 in a step and repeat manner. In this reduction projection aligner, the wafer 3 is aligned with a reference position through the reduction projection lens 2.

Figure 2:
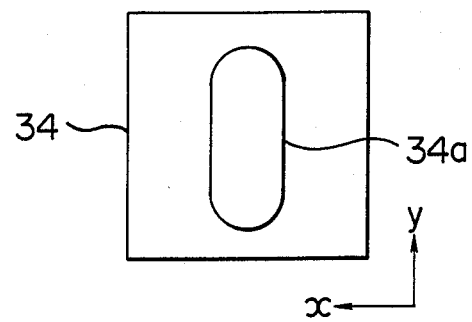
FIG. 2 is an enlarged plan view of a field stop shown in FIG. 1.

Referring to FIG. 1, an optical system for alignment includes an alignment illumination system 20, an optical interference system 36 and a detection signal processing system 48. The alignment illumination system 20 has an Ar laser 30 which is used as a coherent light source and has a wavelength of 0.515 μm. A laser beam emitted from the Ar laser 30 is expanded to a predetermined beam diameter by a beam expander 31, passes through a condenser lens 32, is reflected by a mirror 33, passes through a beam splitter 35 and a relay lens 36a, is reflected by a mirror 37 and a mirror 38 provided on the reticle 1, and then enters the center of an incidence iris 2P of the reduction projection lens 2 to simultaneously illuminate a portion A of an alignment pattern 14 on the wafer 3 and a flat or planar portion B provided in the vicinity thereof. A field stop 34 is provided between the mirror 33 and the beam splitter 35. The field stop 34 has an elliptical aperture 34a which is elongated in a y-direction, as shown in FIG. 2. Illumination light 50 for alignment elliptically shaped by the aperture 34a simultaneously illuminates the portion A of the alignment pattern 14 and the flat portion B provided in the vicinity thereof, as shown in FIG. 18. The alignment illumination light 50 assumes a coherent collimated beam. Light reflected from the portions A and B on the wafer 3 is reflected by the mirror 38 on the reticle 1 and is then imaged or focused at a position 200 below the reticle 1. The image passes through the relay lens 36a of the optical interference system 36 and the beam splitter 35 and is again focused onto a beam splitting mirror 39. The reflected light from the flat portion B is transmitted by the beam splitting mirror 39 as it is, and is then reflected by a half mirror 42 through a relay lens 41a and a mirror 44. On the other hand, the reflected light from the portion A of the alignment pattern 14 is reflected by the beam splitting mirror 39 so that it is reflected by a mirror 40 and passes through a relay lens 41b and the half mirror 42. Both the reflected lights interfere's with each other in the half mirror 42 to produce a interference pattern corresponding to a pattern shape of the alignment pattern 14. The interference pattern is imaged onto a two-dimensional solid state image pickup element 47 by an imaging lens 46.

Figure 3:
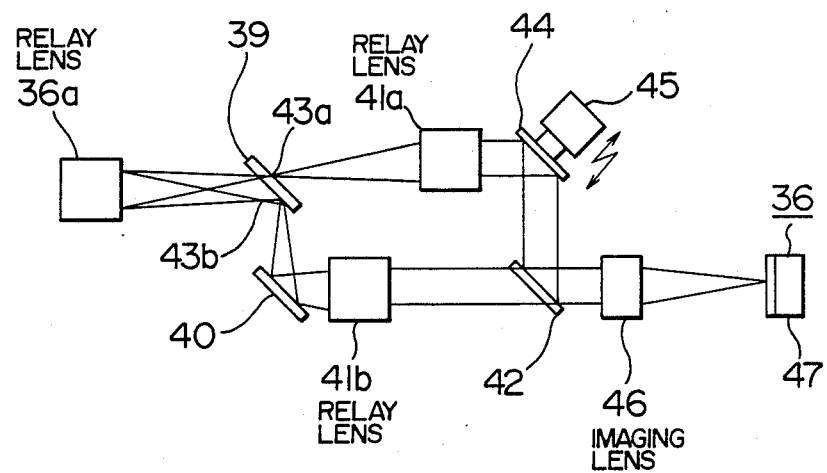
FIG. 3 is an enlarged view of an optical interference system shown in FIG. 1.

Next, the optical interference system 36 will be explained by use of an enlarged view thereof shown in FIG. 3.

The optical interference system 36 is basically similar to a Mach-Zehnder interference system. An image of the flat portion B on the wafer 3 and an image of the portion A of the alignment pattern 14 are respectively focused on positions 43a and 43b by the relay lens 36a. FIG. 4A shows the two images on the image splitting mirror 39. The image splitting mirror 39 has a transmittance distribution 76 as shown in FIG. 4B. As shown in FIGS. 4A and 4B, the incident light is transmitted in an area 71 as it is, and the incident light is reflected in an area 72. Accordingly, an image 73 of the portion B is transmitted as it is, so that it enters the relay lens 41a, and an image 74 of the portion A is reflected so that it enters the relay lens 41b. The two reflected lights are recomposed by the half mirror 42 so that they interfere with each other. An interference pattern produced is imaged by the imaging lens 46 onto the two-dimensional solid state image pickup element 47 (which is kept in conjugate relation with a plane on the wafer 3). FIG. 5A shows an interference pattern 79 imaged on the two-dimensional solid state image pickup element 47, in which solid line 77 represents the portion A of the alignment pattern 14 and dotted line represents the flat portion B. Reference numeral 80 corresponds to a portion where the interference intensity greatly changes corresponding to a change in phase at the stepped portion of the alignment pattern 14. FIG. 5B shows the intensity distribution 81 of the interference pattern in an x-direction (or an alignment pattern position detection direction). As is apparent from FIG. 5B, a large contrast can be obtained corresponding to the step shape of the alignment pattern.

Figures 6A, 6B, 6C:
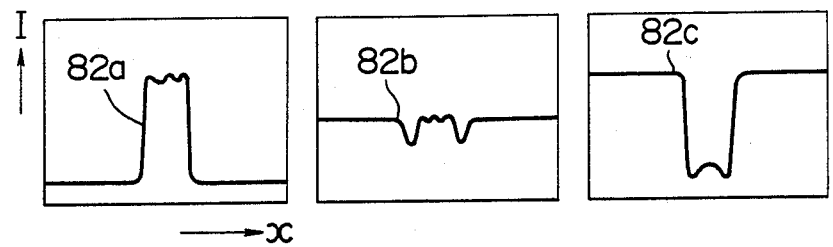
FIGS. 6A, 6B to 6C are views showing a change in contrast of the interference pattern.

The mirror 44 is coupled with a piezo-electric element 45 so that a fine movement of the mirror 44 in a direction indicated by arrow is possible. This construction makes it possible to change a difference in length between two optical paths, so that the contrast 82 of the interference pattern 79 can be arbitrarily changed as shown by 82a, 82b and 82c in FIGS. 6A, 6B and 6C. Namely, in the case where the optical path length difference $\Delta l$ is $(2N+1)\lambda/2n_r (N=0, 1, 2, 3, \ldots)$, the surroundings of the pattern appear dark and the pattern portion appears bright, as shown in FIG. 6A. In the case where $\Delta l$ is $(2N+1)\lambda/4n_r$, the pattern portion and the surroundings thereof appear with the substantially same brightness, as shown in FIG. 6B. In the case where $\Delta l$ is $N \cdot /n_r$, the surroundings of the pattern appear bright and the pattern portion appears dark, as shown in FIG. 6C.

Accordingly, it is also possible to always monitor the contrast 82 of the intensity distribution 81 of the interference pattern 79 to make a feedback control for the mirror 44 so that the value of contrast becomes maximum.

Information of the intensity distribution of the interference pattern 79 obtained through photo electric conversion by the two-dimensional solid state image pickup element 47 is subjected to noise elimination and A/D conversion by a preprocessing circuit 48a of the detection signal processing system 48 and is thereafter supplied to a computer 49 (see FIG. 1). In the computer 49, the intensity distribution information of the interference pattern 79 is compressed in a direction (or y-direction) perpendicular to the alignment pattern position detection direction for conversion to a one-dimensional signal as shown in FIG. 5B. The symmetry of a waveform of the one-dimensional signal is utilized to determine the center position $x_w$ of the alignment pattern on the wafer (in x-direction). Next, on the basis of a deviation of $x_w$ from the center position $x_r$ of an alignment pattern (not shown) on the reticle 1 which is separately determined, the amount Δ of alignment and an alignment direction are determined. A stage 4 is finely moved in the x-direction in accordance with the determined alignment amount Δ and alignment direction. Alignment in the y-direction can be made in a similar manner to the alignment in the x-direction. After the alignment has been completed, the wafer 3 is exposed to exposure light from an exposure system (not shown) so that a circuit pattern on the reticle 1 is printed on a chip on the wafer 3. The above-mentioned aligning and exposing operation is repeated for every chip.

According to the above-mentioned embodiment, an alignment pattern detection signal with a better symmetry and free of the thickness distribution of a resist film can be obtained, thereby making it possible to eliminate the degradation of alignment precision caused by uneven application of the resist film. Also, though the contrast of an alignment pattern detection signal obtained by the conventional alignment method greatly changes depending on the thickness of the applied resist film as well as the uneven application of the resist film, the present embodiment makes it possible to always set the interference intensity to an inclined portion of curve 59 shown in FIG. 20 by finely moving the mirror 44 in a direction indicated by arrow (see FIG. 1). As a result, the contrast of the detection signal can be kept high, as shown in FIG. 6A or 6C. Further, since the reference light and the alignment pattern detecting light are passed through the same reduction projection lens 2, there is not a fear that a disturbance in phase may be produced between the wave fronts of both the lights.

Figure 7:
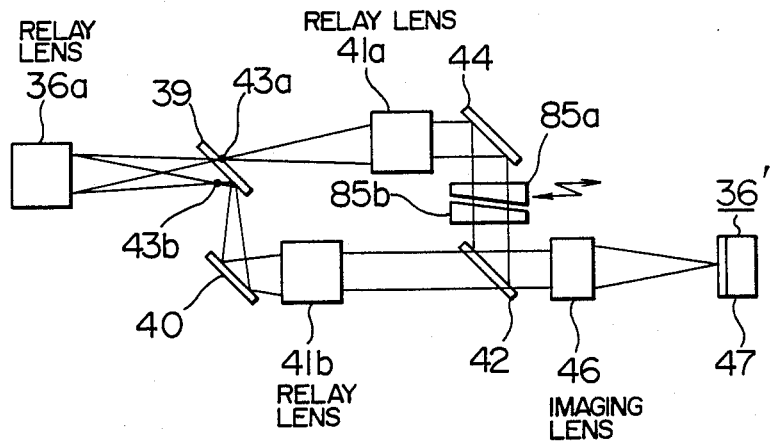
FIG. 7 is an enlarged view of an optical interference system used in a second embodiment of the present invention.

FIG. 7 shows an optical interference system 36' used in a second embodiment of the present invention. A reduction projection aligner according to the second embodiment is the same as that according to the first embodiment shown in FIG. 1 except the optical interference system 36'.

The second embodiment is different from the first embodiment in a method of adjusting a difference in length between two optical paths. Namely, in the first embodiment, the mirror 44 is finely moved by the piezoelectric element 45 in the direction indicated by arrow, as shown in FIG. 3. On the other hand, in the second embodiment shown in FIG. 7, the mirror 44 is fixed while a pair of wedge-shaped glass members 85a and 85b having a uniform thickness as a whole are inserted in an optical path between the mirror 44 and the half mirror 42.

In operation, the fine movement of one of the wedge-shaped glass members 85a and 85b, for example, the glass member 85a brings about a change in glass thickness in the optical path, thereby effectively changing the optical path length. Accordingly, a difference in length between two optical paths can be arbitrarily changed.

As a result, precision for detection of the position of the alignment pattern can be improved like the first embodiment.

Next, a third embodiment of the present invention will be explained by use of FIGS. 8 and 9.

Figure 8:
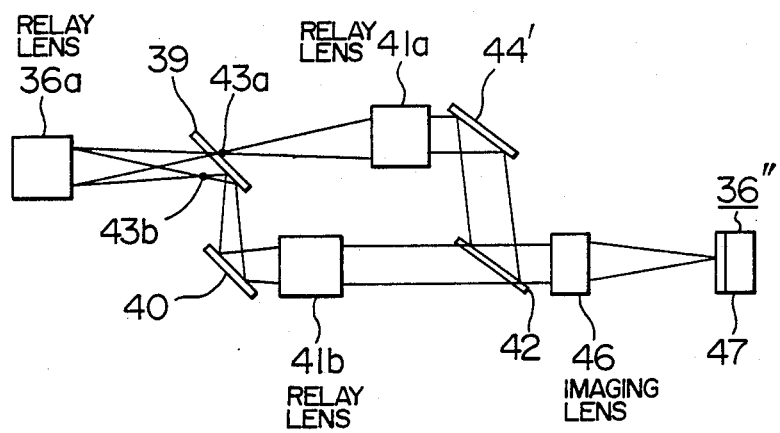
FIG. 8 is an enlarged view of an optical interference system used in a third embodiment of the present invention.

FIG. 8 shows an optical interference system 36'' used in the third embodiment. A reduction projection aligner according to the third embodiment is the same as that according to the first embodiment shown in FIG. 1 except the optical interference system 36''.

Figure 9A:
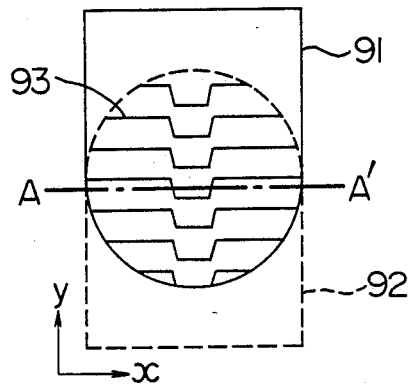
FIG. 9A is a view showing a fringe pattern (or interference pattern) imaged.
Figure 9B:
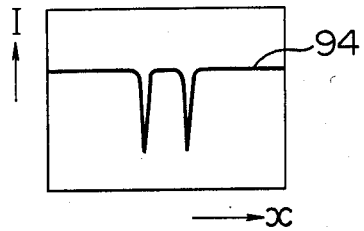
FIG. 9B is a view showing the intensity distribution of the fringe pattern in an x-direction.

The third embodiment is different from the first embodiment in the configuration or manner of interference of reflected light from the portion A of the alignment pattern 14 and reflected light from the flat portion B in the optical interference system. Namely, in the first embodiment (and also in the second embodiments), since the wave fronts of the two reflected lights at the half mirror 42 are parallel to each other, the interference pattern 79 corresponding to the pattern shape of the alignment pattern 14 is obtained, as shown in FIG. 5A. On the other hand, in the third embodiment shown in FIG. 8, a mirror 44' of the optical interference system 36'' is slightly inclined in a direction (y-direction) perpendicular to an alignment pattern position detection direction (x-direction). Therefore, the wave front of each of the two reflected lights is relatively inclined in the y-direction so that a fringe pattern 93 corresponding to the inclination as shown in FIG. 9A is obtained as an interference pattern. In FIG. 9A, solid line 91 represents the portion A of the alignment pattern 14 and dotted line 92 represents the flat portion B. The fringe pattern 93 involves a large signal change caused by a phase change equal to the step depth at the stepped portion of the alignment pattern 14. In the present embodiment, a position at which the signal of the fringe pattern 93 changes corresponding to the stepped portion of the alignment pattern 14 is extracted and the center position of the alignment pattern is determined from the extracted position. For example, by making a horizontal scan direction of the two-dimensional solid state coincident with the x-direction and comparing a horizontal scan signal 94 shown in FIG. 9B (corresponding to an A—A' portion of FIG. 9A) with a predetermined threshold value, the center position of the alignment pattern 14 can be determined from the number of picture elements corresponding to the threshold value level. Alternatively, the symmetry of the horizontal scan signal 94 can be used to determine the center position of the alignment pattern 14. The center position of the alignment pattern 14 can be also determined from a phase change position of the periodic signal of the fringe pattern 93 in the y-direction. Accordingly, an effect similar to that in the first embodiment can be also obtained in the third embodiment.

Figure 11:
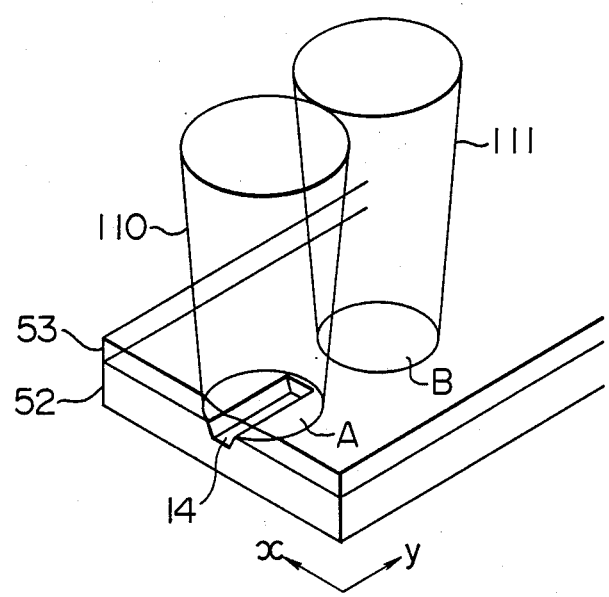
FIG. 11 is an enlarged perspective view showing the state of incidence of two illumination lights.
Figure 12:
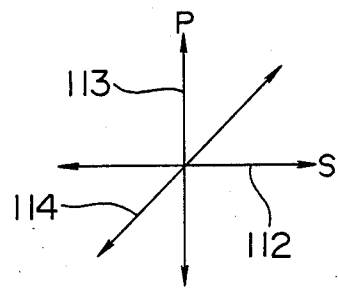
FIG. 12 is a view showing the polarization angle of a polarizing plate.
Figure 13:
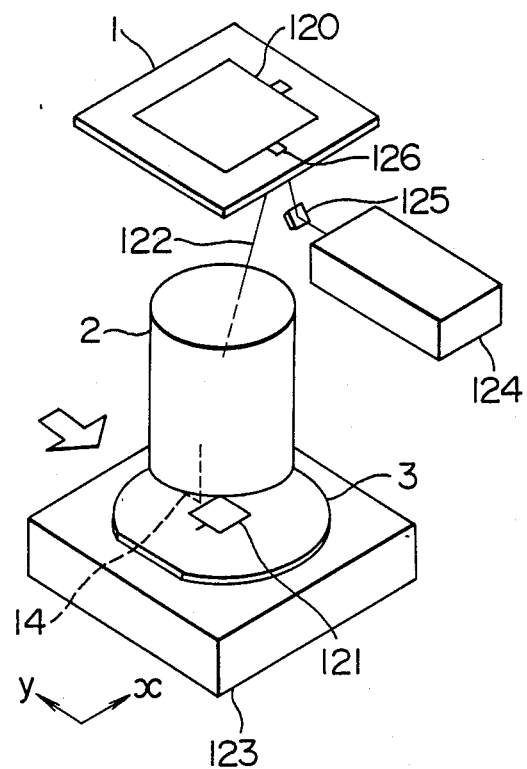
FIG. 13 is a perspective view showing an example of a reduction projection aligner or stepper which employs the conventional TTL alignment method.
Figure 14:
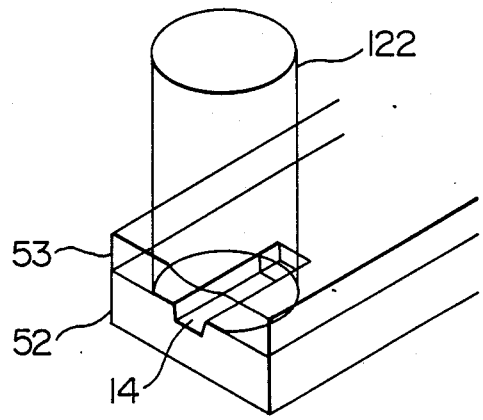
FIG. 14 is an enlarged perspective view showing a layer structure of the conventional alignment pattern and the state of incidence of illumination light for alignment.
Figure 15A:
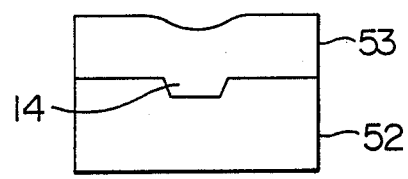
FIG. 15A is a cross section of an alignment pattern having a resist film symmetrically applied thereon.
Figure 15B:
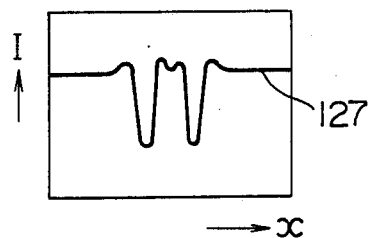
FIG. 15B shows a detection signal waveform derived from the alignment pattern shown in FIG. 15A.
Figure 16A:
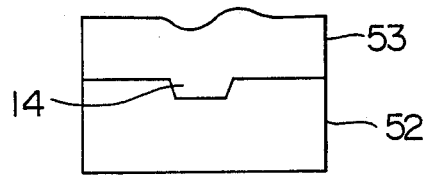
FIG. 16A is a cross section of an alignment pattern having a resist film asymmetrically applied thereon.
Figure 16B:
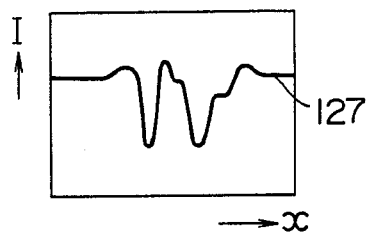
FIG. 16B shows a detection signal waveform derived from the alignment pattern shown in FIG. 16A.

A fourth embodiment of the present invention will now be explained by use of FIGS. 10 to 12.

Figure 10:
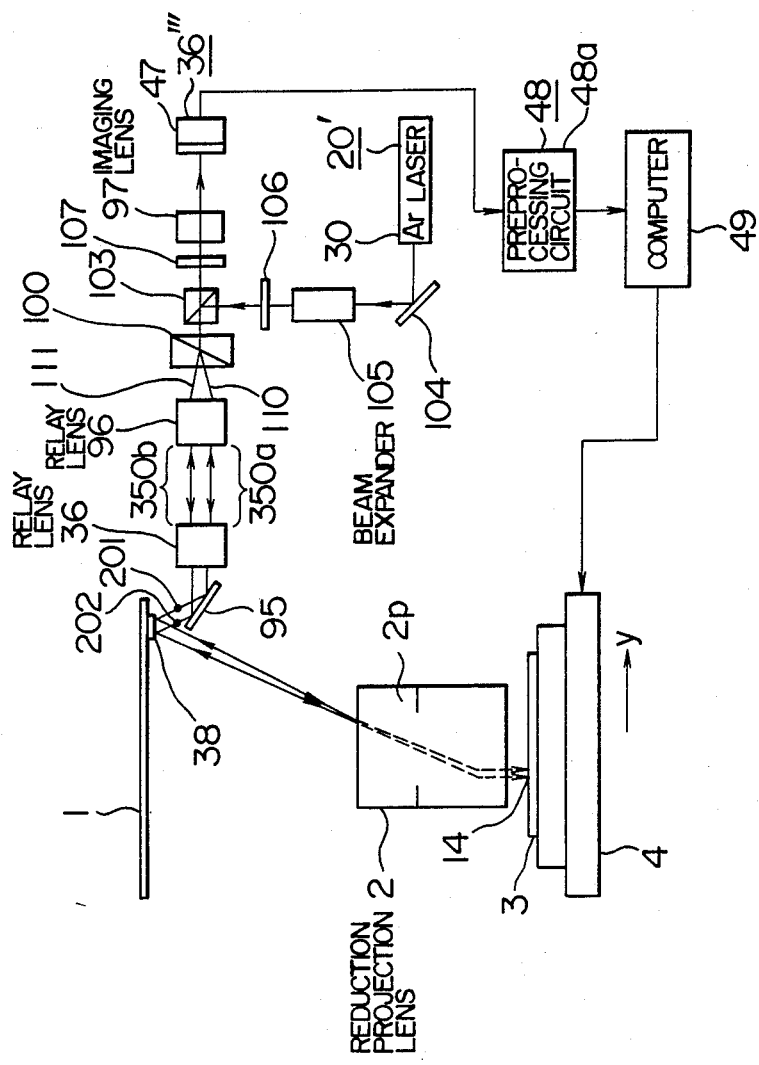
FIG. 10 is a view showing a reduction projection aligner according to a fourth embodiment of the present invention.

As shown in FIG. 10, an optical system for alignment includes an alignment illumination system 20', an optical interference system 36''' and a detection signal processing system 48. The alignment illumination system 20' has an Ar laser 30 which is used as a coherent light source and has a wavelength of 0.515 μm. A linearly polarized laser beam emitted from the Ar laser 30 is reflected by a mirror 104, is expanded to a predetermined beam diameter by a beam expander 105, is transformed by a quarter-wave (λ/4) plate 106 to a circularly polarized beam inclusive of a P polarized component and a S polarized component, is reflected by a beam splitter 103, and is separated into an S polarized beam 110 and a P polarized beam 111 by a Wollaston prism 100. Each of the beams 110 and 111 passes through relay lenses 96 and 36a, is reflected by a mirror 95 and a mirror 38 on a reticle 1, and then enters an incidence iris 2P of a reduction projection lens 2 to simultaneously illuminate a portion A of an alignment pattern 14 on a wafer 3 and a flat portion provided in the vicinity thereof. (FIG. 11 shows the state of incidence of the beams 110 and 111 upon the wafer.) Thereafter, reflected lights from the portions A and B on the wafer 3 take the same paths as the incident lights and are respectively imaged or focused at positions 201 and 202 below the reticle 1. The reflected lights pass through the relay lenses 36a and 96 and are then superimposed on each at the Wollaston prism 100. Since the two reflected lights include the S polarized component and the P polarized component, they do not interfere with each other unless they are subjected to any treatment. A polarizing plate 107 having its polarization direction 114 set so as to be substantially intermediate between the direction 112 of S polarization and the direction 113 of P polarization as shown in FIG. 12 is disposed behind the beam splitter 103. With such an arrangement, the two reflected lights assume the same polarization characteristic and hence interfere with each other so that an interference pattern similar to that shown in FIG. 5A is obtained. The interference pattern is imaged through an imaging lens 97 onto a two-dimensional solid state image pickup element 47 for photo-electric conversion. Any explanation of the subsequent signal processing and aligning operation will be omitted since it is the same as the first embodiment.

In the fourth embodiment, a pair of wedge-shaped glass members may be disposed, for example, in either one of optical paths 350a and 350b of the S and P polarized beams, like the second embodiment shown in FIG. 7, in order to adjust the length of the optical path so that the contrast of the interference pattern can be always kept high. Also, it is obvious that the separated P polarized beam and S polarized beam may be directly incident via the mirror 95 upon the portion A and the portion B on the wafer through the reduction projection lens 2 without using the quarter-wave (λ/4) plate 106 and the Wollaston prism 100.

Also in the fourth embodiment, precision for detection of the position of the alignment pattern can be improved like the first embodiment. The optical system for alignment used in the fourth embodiment is provided with a simple construction. Therefore, the improvement of stability of a detection signal and the reduction of cost can be attained.

In the fourth embodiment, the Wollaston prism has been used for the separation and composition of the Ar laser beam. However, this imposes no limitation on the invention. For example, a Rochon prism can be used.

As has been mentioned above, the present invention makes it possible to eliminate the degradation of alignment precision which may be caused by the thickness of a resist film and uneven application of the resist film and threatens to assume a serious problem with the increased integration of a semiconductor circuit which problem has hitherto been known in the conventional TTL alignment method but was not solved. As a result, high reproducibility and high reliability can be obtained. Also, according to the present invention, a through-put equivalent to that in the conventional chip alignment method can be obtained and there can be obtained precision and total performance which are high as compared with the conventional method.

Further, a contrast can be changed and hence a high signal contrast can be obtained corresponding to the step shape of an alignment pattern. As a result, precision for detection of the position of the alignment pattern can be improved.

Furthermore, if light having a coherence which is temporally high (or light having a single wavelength) and spatially high (or light derived as a substantially collimated beam from a point source) is used as illumination light for alignment, an interference pattern having a high contrast can be obtained.

Moreover, either the wave front of reflected light from an alignment pattern on a wafer or the wave front of reflected light from a flat portion on the wafer may be inclined in a direction perpendicular to an alignment pattern position detecting direction, thereby making it possible to obtain a fringe pattern corresponding to the inclination of the wave front. The center position of the alignment pattern can be determined by detecting a position at which the fringe pattern changes at the position of the stepped portion of the alignment pattern. Thereby, precision for detection of the position of the alignment pattern can be improved.

We claim:

1. A projection alignment apparatus for aligning a mask and a wafer with each other through an optical imaging system, comprising:
   illumination means for illuminating with highly coherent illumination light an alignment pattern formed with a stepped pattern on said wafer and a flat portion of said wafer in the vicinity of said alignment pattern;
   optical interference means for making reflected light from said alignment pattern on said wafer and reflected light from said flat portion of said wafer illuminated by said illumination means interfere with each other while optically superimposing optical images of both the reflected lights obtained through said optical imaging system on each other;
   photo-electric conversion means for subjecting an interference pattern obtained by said optical interference means to photo-electric conversion, thereby obtaining a signal having a symmetry which represents a stepped portion of said alignment pattern; and
   alignment means for performing alignment for said wafer with the mask on the basis of the signal obtained from said photo-electric conversion means.

2. A projection alignment apparatus according to claim 1, wherein said optical interference means includes optical path length adjusting means for adjusting a difference in length between optical paths for said optical images.

3. A projection alignment apparatus according to claim 2, wherein said optical path length adjusting means is composed of an optical element in which refraction of light effects the adjustment of the optical path.

4. A projection adjustment apparatus according to claim 2, wherein said optical length adjusting means includes an optical reflecting element and moving means for moving said optical reflecting element.

5. A projection alignment apparatus according to claim 1, wherein said optical interference means includes separating means for separating said optical images obtained through said optical imaging system into respective optical paths and optical composing means for composing lights in the optical paths separated from each other by said separating means.

6. A projection alignment apparatus according to claim 5, wherein said optical interference means further includes optical path length adjusting means for adjusting the length of one of the optical paths between said separating means and said optical composing means.

7. A projection alignment apparatus according to claim 1, wherein said optical interference means includes separating means for separating said optical images obtained through said optical imaging means into respective optical paths, optical path length adjusting means for adjusting a difference in length between the optical paths separated from each other by said separating means, and optical composing means for composing lights in the optical paths subjected to the adjustment by said optical path length adjusting means.

8. A projection alignment apparatus according to claim 7, wherein said optical path length adjusting means is composed of an optical element in which refraction of light effects the adjustment of the optical path.

9. A projection alignment apparatus according to claim 8, wherein said optical element includes a plurality of wedge-shaped glass members which are movable relative.

10. A projection alignment apparatus according to claim 7, wherein said optical path length adjusting means includes an optical reflecting element and moving means for moving said optical reflecting means.

11. A projection alignment apparatus according to claim 10, wherein said moving means is composed of a piezo-electric element.

12. A projection alignment apparatus according to claim 1, wherein said illumination means illuminates said alignment pattern on said wafer and said flat portion of said wafer with lights having different polarized components, respectively.

13. A projection alignment apparatus according to claim 12, wherein said optical interference system includes an optical composing element for superimposing optical images for the polarized lights on each other and polarizing means for making the different polarized components superimposed by said optical composing means interfere with each other while matching them with each other.

14. A projection alignment apparatus according to claim 13, wherein said optical composing element is composed of a Wollaston prism.

15. A projection alignment apparatus according to claim 1, wherein said optical images are formed by reflection at a peripheral lower surface portion of said mask.

16. A projection alignment method of aligning a mask and wafer with each other through an optical imaging system, comprising the steps of:

illuminating with highly coherent illumination light an alignment pattern formed with a stepped pattern on said wafer and a flat portion of said wafer in the vicinity of said alignment pattern through said optical imaging system;

making reflected light from the illuminated alignment pattern on said wafer and reflected light from the illuminated flat portion of said wafer interfere with each other while optically superimposing optical images of both the reflected lights obtained through said optical imaging system on each other;

subjecting an interference pattern obtained by the interference to photo-electric conversion to detect a signal having a symmetry which represents a stepped portion of said alignment pattern; and performing alignment for said wafer on the basis of the detected signal.

17. A projection alignment method according to claim 16, wherein a difference in length between an optical path for the reflected light from said alignment pattern on said wafer and an optical path for the reflected light from said flat portion of said wafer is adjusted to emphasize a signal derived from the stepped portion of said alignment pattern.

18. A projection alignment method according to claim 16, wherein said illumination light has a coherence which is temporally and spatially high.

19. A projection alignment method according to claim 16, wherein any influence of interference of lights caused by uneven thickness of a resist film applied on said alignment pattern is reduced and a highly symmetrical signal is derived from the stepped portion of said alignment pattern.

20. A projection alignment method according to claim 19, wherein a plurality of light-permeable layers are formed on said alignment pattern.

* * * * *